(12) United States Patent
Beck

(10) Patent No.: US 10,670,678 B2
(45) Date of Patent: Jun. 2, 2020

(54) MR IMAGING USING STACK-OF STARS ACQUISITION

(71) Applicant: KONINKLIJKE PHILIPS N.V., Eindhoven (NL)

(72) Inventor: Gabriele Marianne Beck, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 76 days.

(21) Appl. No.: 15/580,402

(22) PCT Filed: Jun. 12, 2016

(86) PCT No.: PCT/EP2016/063413
§ 371 (c)(1),
(2) Date: Dec. 7, 2017

(87) PCT Pub. No.: WO2016/202707
PCT Pub. Date: Dec. 22, 2016

(65) Prior Publication Data
US 2018/0149721 A1 May 31, 2018

(30) Foreign Application Priority Data
Jun. 15, 2015 (EP) .................................. 15172087

(51) Int. Cl.
*G01R 33/48* (2006.01)
*G01R 33/561* (2006.01)
(Continued)

(52) U.S. Cl.
CPC ..... *G01R 33/4826* (2013.01); *G01R 33/5601* (2013.01); *G01R 33/5611* (2013.01); *G01R 33/56308* (2013.01)

(58) Field of Classification Search
CPC ............ G01R 33/4818; G01R 33/4824; G01R 33/4826; G01R 33/5601; G01R 33/5611; G01R 33/56308
See application file for complete search history.

(56) References Cited

U.S. PATENT DOCUMENTS

| | | | |
|---|---|---|---|
| 5,713,358 A | 2/1998 | Mistretta et al. | |
| 5,873,825 A | 2/1999 | Mistretta et al. | |

(Continued)

FOREIGN PATENT DOCUMENTS

| | | |
|---|---|---|
| DE | 19816961 A1 | 6/1999 |
| WO | 2013159044 A | 10/2013 |
| WO | 2014085288 A1 | 6/2014 |

OTHER PUBLICATIONS

Peters D.C. et al.: "Radial Undersampling that is Variable in kz",Proceedings of the International Society for Magnetic Resonance in Medicine, Joint Annual Meeting ISMRM-ESMRMB, May 19, 2007 (May 19, 2007), p. 304.

(Continued)

*Primary Examiner* — Rishi R Patel

(57) ABSTRACT

An object (10) is placed in an examination volume of a MR device (1). To enable fast MR imaging, a stack-of-stars acquisition scheme is employed with a reduced level of streaking artifacts. The acquisition scheme includes subjecting the object (10) to an imaging sequence of at least one RF pulse and switched magnetic field gradients and acquiring MR signals according to the stack-of-stars scheme. The MR signals are acquired as radial k-space profiles (S1-S12) from a number of parallel slices (21-27) arranged at different positions along a slice direction. The radial density of the k-space profiles (S1-S12) varies as a function of the slice position with the radial density being higher at more central k-space positions and lower at more peripheral k-space positions. The k-space profiles are acquired at a higher (Continued)

temporal density from slices at the more central positions than from slices at the more peripheral k-space positions. An MR image is reconstructed from the MR signals.

18 Claims, 2 Drawing Sheets

(51) Int. Cl.
*G01R 33/56* (2006.01)
*G01R 33/563* (2006.01)

(56) References Cited

U.S. PATENT DOCUMENTS

| | | | |
|---|---|---|---|
| 5,881,728 | A | 3/1999 | Mistretta et al. |
| 6,404,194 | B1 | 6/2002 | Irarrazabal et al. |
| 7,853,060 | B2 | 12/2010 | Schmitt et al. |
| 8,742,757 | B2 | 6/2014 | Du |
| 9,575,153 | B2 | 2/2017 | Simonetti et al. |
| 2009/0105582 | A1 | 4/2009 | Dougherty et al. |
| 2013/0006098 | A1 | 1/2013 | Schmitt |
| 2013/0307537 | A1 | 11/2013 | Yoshizawa et al. |
| 2014/0018666 | A1 | 1/2014 | Koktzoglou et al. |
| 2015/0077112 | A1 | 3/2015 | Otazo et al. |
| 2015/0327783 | A1* | 11/2015 | Wang .................. A61B 5/0263 600/419 |
| 2016/0266223 | A1* | 9/2016 | Bi ...................... A61B 5/02007 |

OTHER PUBLICATIONS

Song et al "K-Space Weighted Image Contrast (KWIC) for Contrast Manipulation in Projection Reconstruction MRI" Magnetic Resonance in Medicine vol. 44, 2004 p. 825-832.

Wu et al "GE-MRA of the Lower Extremeties Using Hypr Stack of Stars" Journal of Magnetic Resonance Imaging 29: p. 917-923 (2009).

Knoll et al "Fast Reduction of Undersampling Artifacts in Radial MR Angiography With 3D Total Variation of Graphics Hardware" University Graz , SFB Report No. 2009-022 May 2009.

Block et al "Towards Routine Clinical Use of Radial Stack of Stars 3D Gradient Echo Sequences for Reducing Motion Sensitivity" JKSMRM, 18(2) 2004 p. 87-106.

Kecskemeti et al "High Resolution Three Dimensional Cine Phase Contrast MRI of Small Intracranial Aneurysms . . . " Journal of Magnetic Resonance Imaging, 35: p. 518-527 (2012).

Lee et al "Fast 3D Imaging Using Variable Density Spiral Trajectories With Applicaitons to Limb Perfusion" Magnetic Resonance in Med. 50: p. 1276-1285 (2003).

Li Z. et al.: "Highly Accelerated 3D Dynamic Imaging with Variable Density Golden Angle Stack-of-Stars Sampling", Proceedings of the International Society for Magnetic Resonance in Medicine, ISMRM 21st Annual Meeting & Exhibition, Apr. 7, 2013 (Apr. 7, 2013), p. 3797.

Feng L. et al.: "K-t Radial Sparse-Sense: Combination of Compressed Sensing and Parallel Imaging with Golden Angle Radial Sampling for Highly Accelerated Volumetric Dynamic MRI", Proceedings of the International Society for Magnetic Resonance in Medicine, 20th Annual Meeting & Exhibition, May 5, 2012 (May 5, 2012), p. 81.

Bhat Himanshu et al: "Contrast-enhanced whole-heart coronary magnetic resonance angiography at 3 T with radial EPI.", Magnetic Resonance in Medicine Jul. 2011, vol. 66, No. 1, Jul. 2011 (Jul. 2011), pp. 82-91.

Kust M.P. etal.: "Anisotropic Methods for Three-Dimensional Projection Magnetic Resonance Imaging", Proceedings of the International Society for Magnetic Resonance in Medicine, ISMRM, 2030 Addison Street, 5th Annual Meeting, Apr. 12, 1997 (Apr. 12, 1997).

\* cited by examiner

MR IMAGING USING STACK-OF STARS ACQUISITION

CROSS REFERENCE TO RELATED APPLICATIONS

This application is a U.S. national phase application of International Application No. PCT/EP2016/063413, filed on Jun. 12, 2016, which claims the benefit of EP Application Serial No. 15172087.7 filed on Jun. 15, 2015 and is incorporated herein by reference.

FIELD OF THE INVENTION

The invention relates to the field of magnetic resonance (MR) imaging. It concerns a method of MR imaging of an object. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for imaging of soft tissue they are superior to other imaging methods in many respects, do not require ionizing radiation and are usually not invasive.

According to the MR method in general, the object, for example the body of the patient to be examined, is arranged in a strong, uniform magnetic field whose direction at the same time defines an axis (normally the z-axis) of the co-ordinate system on which the measurement is based. The magnetic field produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse), so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

To realize spatial resolution in the body, constant magnetic field gradients extending along the three main axes are superposed on the uniform magnetic field, leading to a linear spatial dependency of the spin resonance frequency. The signal picked up in the receiving coils then contains components of different frequencies which can be associated with different locations in the body. The signal data obtained via the receiving coils corresponds to the spatial frequency domain and is called k-space data. The k-space data usually includes multiple lines acquired with different phase encoding. Each line is digitized by collecting a number of samples. A set of k-space data is converted to a MR image by means of an image reconstruction algorithm.

In the known so-called three-dimensional (3D) stack-of-stars acquisition scheme (see, e.g., WO 2013/159044 A1), a number of spatially non-selective or slab-selective RF excitations is applied, each followed by the acquisition of one or more MR signals (e.g. gradient echo signals), wherein each MR signal represents a k-space profile. The MR signals are acquired as radial k-space profiles from a number of parallel slices. The slices are arranged at different positions along a slice direction. In the slice direction (e.g. the $k_z$-direction) standard Cartesian phase-encoding is performed, while the MR signals are acquired within each single slice along radial "spokes" that are rotated around the center ($k_x=k_y=0$). This results in a cylindrical k-space coverage composed of stacked discs ("stack-of-stars"). Technically, this is realized by generating magnetic field gradients in the in-plane directions of the slices simultaneously and modulating their amplitudes. Different schemes can be used for selecting the temporal order of the k-space profile acquisition steps. E.g., all phase-encoding steps along the slice direction can be acquired sequentially before k-space profiles at different angular positions are acquired. This ensures that periods of Cartesian sampling are kept short, which leads to high data consistency within the stack of slices and preserves the general motion-robustness of radial sampling for the stack-of-stars approach. The Cartesian phase-encoding steps may be performed from the center slice to the k-space periphery (centric out), or in linear order from $-k_{z,max}$ to $+k_{z,max}$. For the angular ordering, the imaging sequence can use either equidistant angular sampling with multiple interleaves or the so-called golden angle-scheme. In the equidistant scheme, the angular distance is calculated according to $\Delta\Phi=180°/n_{total}$ where $n_{total}$ is the total number of spokes. It may be beneficial to acquire the spokes using multiple interleaves (or "rotations") because the interleaving reduces temporal coherences in k-space. Thus, motion inconsistencies are spread out in k-space and artifacts are attenuated. In the golden angle-scheme, the angle of the k-space profile is incremented each time by $\Delta\Phi=111.25°$, which corresponds to 180° multiplied by the golden ratio. Therefore, subsequently sampled spokes always add complementary information while filling the largest gaps within the previously sampled set of spokes. As a consequence, any sequential set of acquired spokes covers k-space approximately uniformly, which enables reconstruction of temporal sub-frames and makes the golden-angle scheme well-suited for dynamic imaging studies.

The afore-described 3D radial stack-of-stars scheme offers several promising advantages for clinical MR imaging like high motion-robustness, benign aliasing artifacts and a continuous updating of k-space center. However, despite these benefits streaking artifacts are often a problem. A higher required radial sampling density and, thus, longer scan times are the consequence.

The ISMRM-abstract 2007 p. 207 'Radial undersampling that is variable in $k_z$' by D. C. Peters et al. discloses a stack-of-stars sampling approach in k-space. A radial undersampling pattern which varies in the $k_z$-dimension is used, acquiring a greater number of projections for central $k_z$-space.

SUMMARY OF THE INVENTION

From the foregoing it is readily appreciated that there is a need for an improved MR imaging technique. It is consequently an object of the invention to enable fast MR imaging using the stack-of-stars acquisition scheme with a reduced level of streaking artifacts.

In accordance with the invention, a method of MR imaging of an object placed in an examination volume of a MR device is disclosed. The method comprises:
  subjecting the object to an imaging sequence of at least one RF pulse and switched magnetic field gradients,
  acquiring MR signals according to a stack-of-stars scheme, wherein the MR signals are acquired as radial k-space profiles at a number of different angular positions from a number of parallel slices arranged at different positions along a slice direction, wherein the radial density of the k-space profiles varies as a function of the slice position, wherein the radial density is higher at more central k-space positions and lower at more peripheral k-space positions, wherein k-space profiles are acquired at a higher temporal density, i.e. number of k-space profiles acquired per unit of time, from slices at more central k-space positions than from slices at more peripheral k-space positions and
  reconstructing a MR image from the MR signals.

The invention proposes to apply a modified stack-of-stars acquisition strategy. The modification is that the radial k-space sampling density (i.e. the number of differently oriented radial k-space profiles per slice) is varied from slice to slice. The radial density of the k-space profiles is higher in slices that are located closer to the k-space center ($k_z$=0), while the radial density of the k-space profiles is lower in slices that are located more remotely from the k-space center.

The increased density of radial k-space sampling near the k-space center results in a reduced level of streaking artifacts while the total scan time can be kept at a minimum.

Due to the regular update of the central region of k-space, radial k-space sampling is generally known to be interesting in the context of contrast-enhanced MR imaging as it allows to follow the uptake of a contrast agent in a region of interest. Nevertheless, even in combination with a k-space weighted image contrast method (see Song et al., Magnetic Resonance in Medicine, vol. 44, 2004, pp. 825-832) for contrast manipulation, a time series of MR images reconstructed from a conventional radial stack of stars-acquisition shows a blurred contrast enhancement profile such that the time points at which the contrast agent reaches particular image voxels cannot be clearly distinguished. This can be improved by the method of the invention.

In a preferred embodiment, the invention suggests an acquisition order in which the radial k-space profiles are acquired at a higher temporal density from slices at more central k-space positions than from slices at more peripheral k-space positions. In other words, the radial k-space profiles within a central Nyquist ellipsoid are acquired at close time points while peripheral radial k-space profiles (i.e. outside the Nyquist ellipsoid) are sampled at more distant time points. Note that, as more samples from k-space are acquired, the size of the central Nyquist ellipsoid inside which the (radial) density of the sampled k-space profiles equals or is higher is that the Nyquist criterion for the field-of-view will gradually increase radially outward in k-space whereas the (radial) density of the sampled k-space profiles in peripheral k-space is equal or less than the Nyquist criterion for the field-of-view. The actual size of the Nyquist ellipsoid determines the spatial resolution of the reconstructed MR image.

This approach improves contrast-enhanced MR imaging. The increased temporal density at the central k-space ellipsoid ensures that contrast time points at which the contrast agent reaches particular image voxels are captured.

Each MR image is then reconstructed using within the Nyquist ellipsoid only the k-space profiles acquired at the respectively closest time points in combination with the k-space profiles acquired from the peripheral k-space regions (which are sampled at more distant time points). This means that MR signal parts acquired closest in time to each other are selected in the central—fully sampled or oversampled—ellipsoid k-space region for reconstructing the MR image. For the peripheral k-space MR ellipsoids, only partial radial spokes in k-space are selected that extend from outward radial k-space positions. These partial spokes have a higher angular density as they move to outwards peripheral k-space MR ellipsoids.

With this approach, the time points at which the contrast agent reaches particular image voxels can be more clearly distinguished, because only temporally closely acquired MR signals are used for MR image reconstruction in the k-space center. Blurring of the measured contrast enhancement profile is thus reduced.

MR signals at k-space positions outside the ellipsoid may be removed prior to reconstructing the MR image. This constitutes an ellipsoidal "shutter" in k-space. This effectively eliminates streaking artifacts. In further advantageous implementations the center region of k-space may be oversampled (at higher sampling density than the Nyquist criterion), which makes the acquisition of MR signals more robust for motion artefacts.

In a more refined implementation for reconstruction of the MR image, MR signals from the peripheral k-space are selected along partial radial spokes in k-space that extend from outward radial k-space positions and these partial spokes having a higher angular density in k-space as their outward radial k-space positions are more radially outward in k-space. The partial spokes extend from their outward radial k-space position that is in each of the $k_z$-planes radially separated from the $k_z$-axis of the stack-of-stars. This may be implemented in that in individual $k_z$-planes a centre region is fully sampled or even oversampled, e.g. by first sampling along (three) radial spokes that are angularly offset in k-space by the golden angle. In one or several intermediate ring shaped regions around the centre region in k-space selection of the MR signals for reconstruction is along several partial radial spokes that extend from outward radial positions offset from the $k_z$-axis in addition to selection along the radial spokes that originate from the $k_z$-axis and also sample the centre k-space region. In the periphery of k-space, radially beyond the one or more intermediate ring shaped regions, selection is added along further partial spokes in k-pace extending form outward radial positions beyond the intermediate ring shaped regions. The angular density of the partial radial spokes in k-space increases radially outward.

Sampling of the centre region of k-space is done such that samples are added at a higher temporal rate than adding samples in outward (axial as well as radially in k-space) regions. In the signal acquisition it is preferred to acquire the k-space profiles along the radial profiles extending from the centre of its slice of the stack-of-stars radially outward. For reconstruction only MR signals from the partial spokes may be selected. It has to be noted that the k-space profiles acquired in the known PROPELLER imaging technique are also considered as radial k-space profiles within the meaning of the present invention. In the PROPELLER concept, MR signals are acquired in k-space in N strips, each consisting of L parallel k-space profiles, corresponding to the L lowest frequency phase-encoding lines in a Cartesian-based k-space sampling scheme. Each strip, which is also referred to as k-space blade, is rotated in k-space by an angle of, for example, 180°/N, so that the total set of MR signals set spans a circle in k-space. Within the meaning of the invention, a stack-of-stars may thus equally be a "stack-of-blades".

According to a preferred embodiment of the invention, the radial density of the k-space profiles varies such that the Nyquist criterion according to a given field-of-view (FOV) is fulfilled within an ellipsoid around the center of k-space. The dimensions of the ellipsoid can be selected according to the required tradeoff between acquisition speed and image quality of the individual imaging task. The invention minimizes the overall scan time while providing oversampling (i.e. a higher radial sampling density than required by the Nyquist criterion) in the image energy-dominating central k-space. The radial sampling density may gradually decrease to the lower radial sampling density in the peripheral k-space regions. In the peripheral regions, i.e. outside the ellipsoid, the radial k-space sampling density may even be below the Nyquist threshold without a significant impact on image quality. Oversampling of k-space occurs according to the method of the invention within the Nyquist ellipsoid, as explained above. This allows to select only MR signals acquired closest in time to each other in the oversampled central k-space region for reconstructing each of the MR images without compromising image quality.

According to a preferred embodiment of the invention, the angle increment of successively acquired k-space profiles is the golden angle. This corresponds to the above-described golden angle-scheme, in which the angle of the k-space profile is incremented each time by $\Delta\Phi=111.25°$. This is particularly advantageous for dynamic imaging.

Preferably, k-space profiles are acquired from at least two different slices at the same angular position before acquiring further k-space profiles at a different angular position. In other words, phase-encoding steps along the slice direction are acquired sequentially before k-space profiles at different golden angle positions are acquired. This ensures that periods of Cartesian sampling are kept short, which leads to high data consistency within the stack of slices and preserves the general motion-robustness.

According to the invention, k-space is sampled with variable density. This may be employed in order to reduce scan time by (motion-optimized) variable density compressed sensing. The k-space profiles may even be distributed irregularly in the peripheral k-space regions, i.e. outside of the ellipsoid in which k-space is fully sampled. The theory of CS is known to have a great potential for significant signal data reduction. In CS theory, a signal data set which has a sparse representation in a transform domain can be recovered from undersampled measurements by application of a suitable regularization algorithm. The possibility of undersampling leads to a significantly reduced acquisition time.

As a mathematical framework for signal sampling and reconstruction, CS prescribes the conditions under which a signal data set can be reconstructed exactly or at least with high image quality even in cases in which the k-space sampling density is far below the Nyquist criterion, and it also provides the methods for such reconstruction. In most existing CS-based MR acquisition and reconstruction schemes the basic CS formulation is used which exploits only the prerequisite that the MR signal data is sparse in a transform domain. It is also known that, since additional prior information about the unknown MR image may be available in certain applications, it is advantageous to incorporate this prior information into the CS reconstruction.

The technique of the invention enables a 3D variable density k-space sampling scheme which is well-suited for CS with a fully sampled small central k-space ellipsoid and undersampling in the peripheral k-space regions.

The method of the invention may be combined in a straight-forward fashion with conventional view sharing, keyhole, or k-t sampling techniques. The k-space profiles may be acquired and reconstructed into the MR image using acceleration techniques such as half scan, or parallel imaging techniques like SENSE or iterative SENSE.

For example, a time series of MR images may be reconstructed from successively acquired MR signals, wherein MR signals acquired from peripheral k-space positions are shared between two or more successive MR images of the series (view sharing) in order to increase the temporal resolution.

The method of the invention described thus far can be carried out by means of a MR device including at least one main magnet coil for generating a uniform static magnetic field within an examination volume, a number of gradient coils for generating switched magnetic field gradients in different spatial directions within the examination volume, at least one RF coil for generating RF pulses within the examination volume and/or for receiving MR signals from an object positioned in the examination volume, a control unit for controlling the temporal succession of RF pulses and switched magnetic field gradients, and a reconstruction unit for reconstructing a MR image from the received MR signals. The method of the invention can be implemented, for example, by a corresponding programming of the reconstruction unit and/or the control unit of the MR device.

The method of the invention can be advantageously carried out in most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
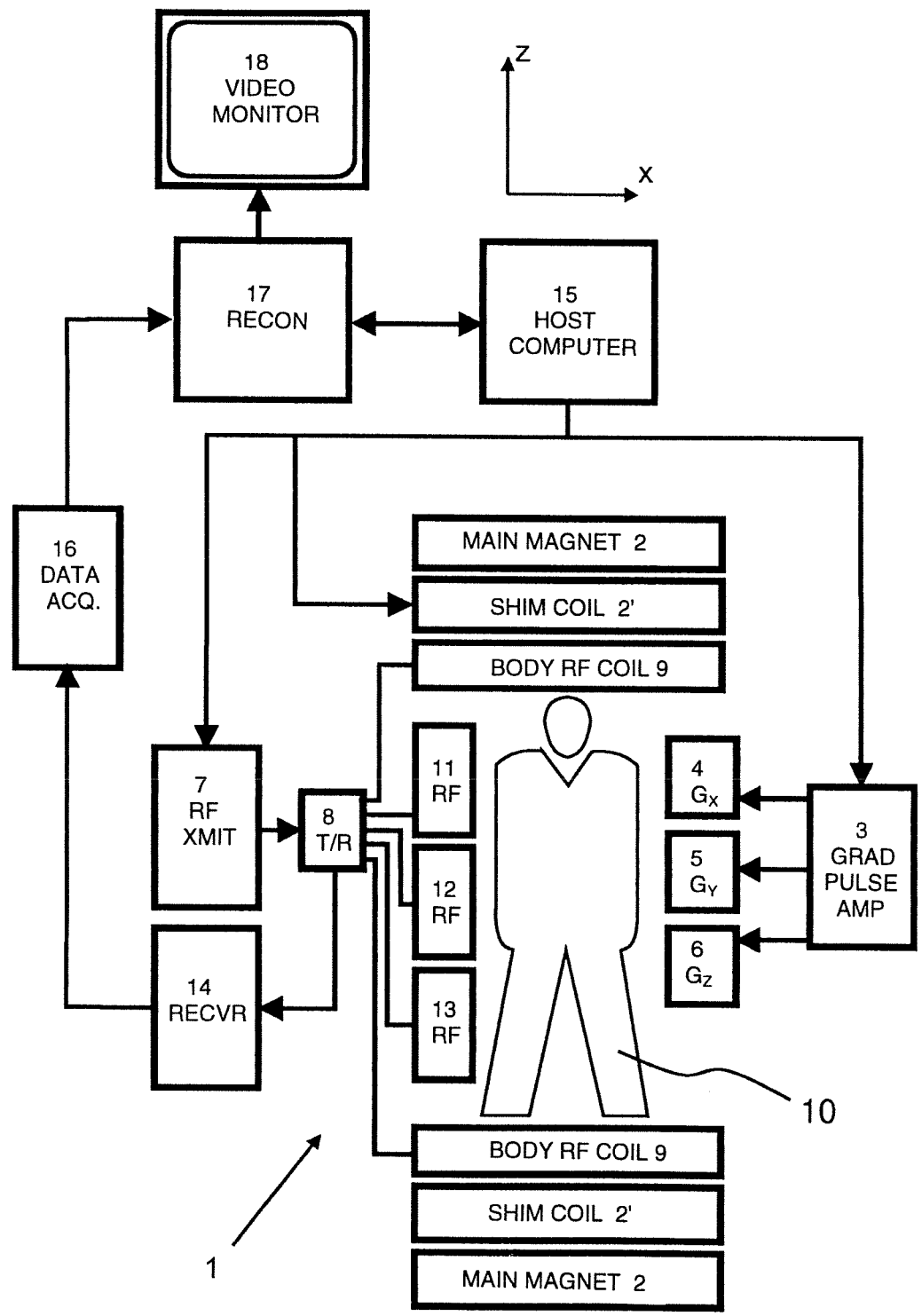
FIG. 1 shows a MR device for carrying out the method of the invention.

With reference to FIG. 1, a MR device 1 is shown. The device comprises superconducting or resistive main magnet coils 2 such that a substantially uniform, temporally constant main magnetic field is created along a z-axis through an examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a whole-body volume RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the whole-body volume RF coil 9.

For generation of MR images of limited regions of the body 10, a set of local array RF coils 11, 12, 13 are placed contiguous to the region selected for imaging. The array coils 11, 12, 13 can be used to receive MR signals induced by body-coil RF transmissions.

The resultant MR signals are picked up by the whole body volume RF coil 9 and/or by the array RF coils 11, 12, 13 and demodulated by a receiver 14 preferably including a preamplifier (not shown). The receiver 14 is connected to the RF coils 9, 11, 12 and 13 via send-/receive switch 8.

A host computer 15 controls the gradient pulse amplifier 3 and the transmitter 7 to generate any of a plurality of MR imaging sequences, such as echo planar imaging (EPI), echo volume imaging, gradient and spin echo imaging, fast spin echo (TSE) imaging, and the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies a Fourier transform or other appropriate reconstruction algorithms. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

Figure 2:
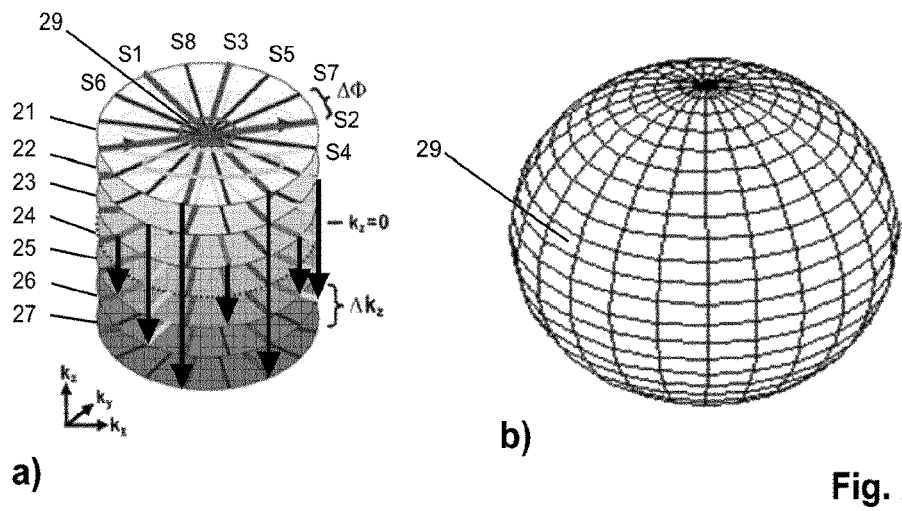
FIG. 2 shows a diagram of k-space schematically illustrating an embodiment of the sampling scheme of the invention.
Figure 3:
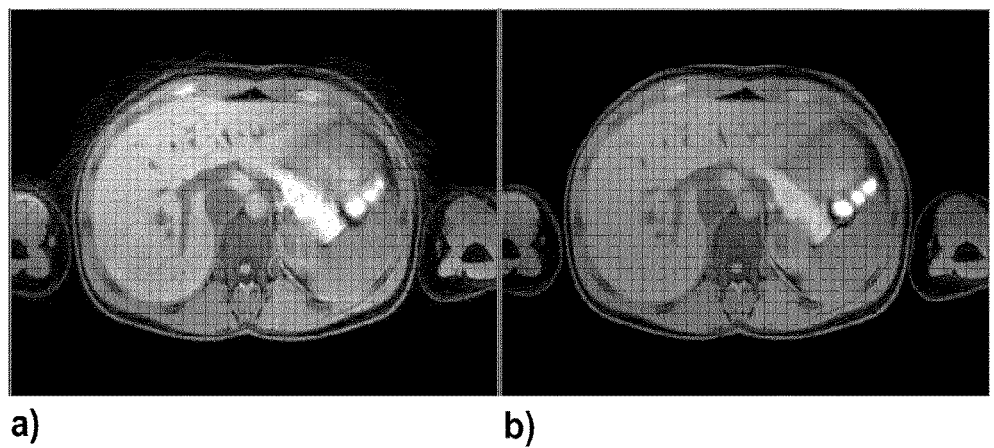
FIG. 3 shows a MR image acquired and reconstructed with higher radial density in central k-space slices according to the invention (FIG. 3b) compared to a MR image conventionally acquired with a lower radial density close to the Nyquist limit (FIG. 3a)
Figure 4:
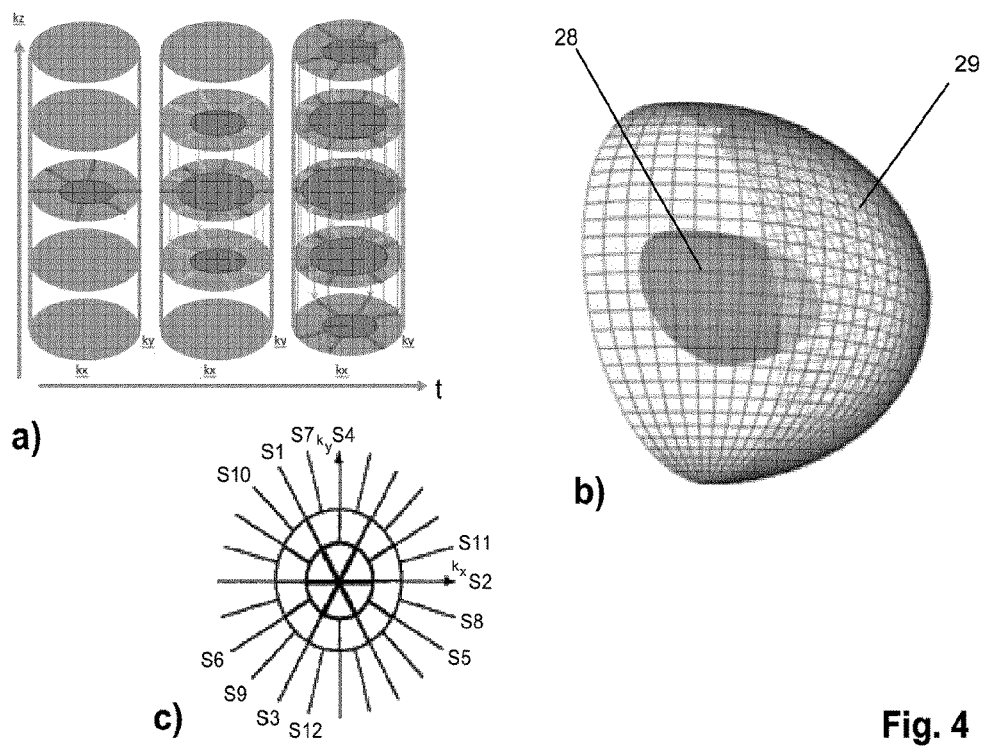
FIG. 4 shows a diagram of k-space schematically illustrating the application of the invention for dynamic imaging.

With continuing reference to FIG. 1 and with further reference to FIGS. 2-4, embodiments of the imaging approach of the invention are explained.

As shown in FIG. 2a, MR signals are acquired (for example using a conventional gradient echo imaging sequence) according to a 3D stack-of-stars acquisition scheme. After each of a number of spatially non-selective or slab-selective RF excitations, one or more MR signals are acquired wherein each MR signal represents a k-space profile. The MR signals are acquired as radial k-space profiles from a number (seven in the embodiment of FIG. 2a) of parallel slices 21, 22, 23, 24, 25, 26, 27. The slices are arranged at different positions along slice direction $k_z$. In the $k_z$-direction Cartesian phase-encoding is performed, while the MR signals are acquired within each single slice along radial "spokes" S1, S2, S3, S4, S5, S6, S7, S8 that are rotated around the center ($k_x=k_y=0$). This results in a cylindrical k-space coverage composed of stacked discs. In the depicted embodiment, phase-encoding steps along the slice direction $k_z$ are acquired sequentially before k-space profiles at different angular positions are acquired. For the angular ordering of the spokes S1, S2, S3, S4, S5, S6, S7, S8 the above-described golden angle-scheme is employed. The angle of the spokes is incremented each time by $\Delta\Phi=111.25°$. According to the invention, the radial density of the k-space profiles, i.e. the number of acquired spokes S1, S2, S3, S4, S5, S6, S7, S8 per slice varies as a function of the slice position, wherein the radial density is higher at more central k-space positions and lower at more peripheral k-space positions. This e.g. is achieved in the embodiment of FIG. 2a as follows: In a first step, spoke S1 is acquired from the inner three slices 23, 24, and 25. This successively is done for the spokes S2 and S3. Successive acquisition of the phase-encoding steps along the slice direction is performed before sampling k-space profiles at different golden angular positions which is essential to ensure high data consistency and general motion-robustness. In a second step, spokes S4 and S5 are acquired only from the inner five slices 22, 23, 24, 25, and 26. In a third step, spokes S6, S7, and S8 are acquired from all seven slices 21, 22, 23, 24, 25, 26, and 27 as indicated by the black arrow. In this way, k-space center (around $k_z=0$) is sampled more densely than the k-space periphery. The radial density of the k-space profiles (the spokes) is varied in this fashion such that the Nyquist criterion according to the given FOV is fulfilled within an ellipsoid 29 (see FIG. 2b) around the center of k-space ($k_x=k_y=k_z=0$). The ellipsoid intersects slice 21 along an ellipse 29, as indicated in FIG. 2a. Within ellipse 29, the Nyquist criterion is fulfilled, while k-space is undersampled outside the ellipse 29. The radii of the respective ellipses in slices 22, 23, 24 increase correspondingly towards $k_z=0$. Optionally, as the ellipsoid 28 covers a sufficiently large centre region of k-space that sufficiently large ellipsoid may act as an ellipsoidal 'shutter' in k-space is employed by removing the MR signals at k-space positions outside the ellipsoid 29 prior to reconstructing a MR image from the acquired MR signals.

The invention minimizes the overall scan time with k-space sampling conforming to the Nyquist criterion. It however can also provide oversampling in the image energy-dominating central k-space. The radial sampling density gradually decreases from the central slices 23, 24, 25 to the lower radial sampling density in the peripheral slices 21, 27. Outside the ellipsoid 29, the radial k-space density may even be below the Nyquist threshold without a significant impact on image quality.

Due to the higher radial sampling density around the k-space center, streaking artifacts are efficiently reduced according to the invention within minimal scan time.

FIG. 3 shows the effect of a higher radial density. Streaking artifacts are efficiently reduced in the MR image of FIG. 3b sampling with a higher radial density according to the invention compared to the MR image of FIG. 3a acquired with a lower radial density.

Due to the regular update of the central region of k-space, the k-space sampling technique of the invention is interesting in the context of dynamic contrast-enhanced MR imaging. A time series of MR images is reconstructed from successively acquired MR signals according to the invention, wherein the radial k-space profiles are acquired at a higher temporal density from slices at more central k-space positions than from slices at more peripheral k-space positions.

This is illustrated in FIG. 4a showing the progression of k-space sampling as a function of time t. The acquisition starts with the acquisition of three k-space spokes (golden-angle acquisition) from the central k-space slice at $k_z=0$ (left diagram). The Nyquist criterion is fulfilled within the depicted solid circle. In the next step, three more spokes are acquired from each of the three inner slices. In the following step, k-space profiles are acquired along another three radial directions from all five slices. The regions in which the Nyquist criterion is fulfilled are indicated as solid circles in all three diagrams. This profile order scheme results in a central 3D k-space Nyquist ellipsoid 28 in which MR signals are acquired at close time points while the periphery outside the ellipsoid k-space shutter 29 of k-space is sampled at more distant time points as shown FIG. 4b.

Oversampling of k-space occurs within the Nyquist ellipsoid 28. FIG. 4c shows the $k_z=0$ slice of the stack of slices of FIG. 4a with successively acquired spokes S1-S12. In the most central circular region of k-space, only the MR signals of spokes S1, S2, S3 are selected for image reconstruction. This MR signal data is supplemented with the MR signals from spokes S1, S2, S3, S4, S5, S6 in the intermediate ring-shaped region of k-space. The MR signal data is completed by the MR signals from all spokes S1-S12 in the remaining peripheral region of k-space. In this way, each MR image of the time series is reconstructed using only the k-space profiles within the Nyquist ellipsoid acquired at the respectively closest time points in combination with the k-space profiles acquired from the peripheral k-space regions which are sampled at more distant time points. In the example shown in FIG. 4a, as time progresses, first more central k-space positions are sampled and then more peripheral k-space positions are sampled. This order may be reversed. Alternatively, the sampling positions' $k_z$-value may e.g. linearly increase or decrease as time progresses.

This strategy enables improved contrast-enhanced MR imaging. The uptake of a contrast agent in a region of interest can be followed with higher accuracy vis-à-vis the prior art. The time points at which the contrast agent reaches particular image voxels can be more clearly distinguished, because only temporally closely acquired MR signals are used for MR image reconstruction in the k-space center. Blurring of the measured contrast enhancement profile is thus reduced.

The invention claimed is:

1. A method of magnetic resonance (MR) imaging of an object placed in an examination volume of a MR device, the method comprising:

subjecting the object to an imaging sequence of at least one RF pulse and switched magnetic field gradients, acquiring MR signals according to a stack-of-stars scheme, wherein the MR signals are acquired as radial k-space profiles at a plurality of different angular positions and from a plurality of parallel slices, the plurality of slices being arranged at different slice positions along a slice direction in k-space, wherein a radial density of the k-space profiles varies as a function of the slice positions along the slice direction, wherein the radial density is higher at more central k-space positions and lower at more peripheral k-space positions along the slice direction in a more peripheral k-space region, such that a higher number of the k-space profiles are acquired at more central slice positions along the slice direction and a lower number of the k-space profiles are acquired at more peripheral slice positions along the slice direction, wherein the k-space profiles are acquired at a higher temporal density from the slices at the more central k-space positions than from the slices in the more peripheral k-space positions, and reconstructing at least one MR image from the MR signals.

2. The method of claim 1, wherein for reconstructing the MR image, MR signals acquired along radial spokes in k-space and spokes acquired closest in time to each other are selected in a central ellipsoid around a center of k-space in which the radial density of the k-space profiles varies such that the Nyquist criterion according to a given field-of-view is fulfilled within the central ellipsoid around the center of k-space.

3. The method of claim 1, wherein for reconstructing the MR image, only MR signals are selected that form partial radial spokes in k-space at the more peripheral k-space positions beyond the central ellipsoid and these partial radial spokes in k-space extend from outer radial k-space positions and these partial spokes having a higher angular density toward peripheral k-space ellipsoids.

4. The method of claim 2, wherein MR signals at the more peripheral k-space positions outside the central ellipsoid are removed prior to reconstructing the MR image.

5. The method of claim 1, wherein the k-space profiles are acquired from at least two different slices at the same angular position before acquiring further k-space profiles at a different angular position.

6. The method of claim 2, wherein the radial density of the k-space profiles varies such that in the central ellipsoid a higher radial density than the Nyquist criterion according to a given field-of-view is used than outside the central ellipsoid and the radial density of the k-space profiles outside the central ellipsoid being equal to or less than the Nyquist criterion.

7. The method of claim 1, wherein an angle increment ($\Delta\Phi$) of successively acquired k-space profiles is the golden angle.

8. The method of claim 1, wherein the k-space profiles are irregularly distributed at the more peripheral k-space positions.

9. The method of claim 1, wherein the MR image is reconstructed using compressed sensing.

10. The method of claim 2, wherein a time series of MR images is reconstructed from successively acquired MR signals, wherein MR signals acquired from the more peripheral k-space positions beyond the central ellipsoid are shared between two or more successive MR images of the series.

11. The method of claim 1, wherein the MR signals are acquired in parallel via a plurality of RF receiving antennas, wherein the MR image is reconstructed using SENSE.

12. A magnetic resonance (MR) device including at least one main magnet coil for generating a uniform, static magnetic field within an examination volume, a plurality of gradient coils for generating switched magnetic field gradients in different spatial directions within the examination volume, at least one RF coil for generating RF pulses within the examination volume and/or for receiving MR signals from an object positioned in the examination volume, a control unit for controlling a temporal succession of the RF pulses and the switched magnetic field gradients, and a reconstruction unit for reconstructing a MR image from the received MR signals, wherein the MR device is arranged to perform the following steps:
 subjecting the object to an imaging sequence of at least one of the RF pulses and the switched magnetic field gradients,
 acquiring the MR signals according to a stack-of-stars scheme, wherein the MR signals are acquired as radial k-space profiles from a plurality of parallel slices arranged at different positions along a slice direction, wherein a radial density of the k-space profiles varies as a function of the slice position along the slice direction, wherein the radial density is higher at more central k-space positions and lower at more peripheral k-space positions,
 wherein a higher number of the k-space profiles are acquired at more central slice positions along the slice direction and a lower number of the k-space profiles are acquired at more peripheral slice positions along the slice direction,
 wherein the radial k-space profiles are acquired at a higher temporal density from slices at the more central k-space positions than from the slices at the more peripheral k-space positions, and
 reconstructing one or more MR image from the MR signals.

13. A non-transitory computer-readable medium carrying computer-readable instructions configured to control one or more computers to:
 generate an imaging sequence including at least one RF pulse and switched magnetic field gradients,
 acquire MR signals according to a stack-of-stars scheme, wherein the MR signals are acquired as radial k-space profiles from a plurality of parallel slices arranged at different positions along a slice direction, wherein a radial density of the k-space profiles varies as a function of the slice position along the slice select direction, wherein the radial density is higher at more central k-space positions and lower in a more peripheral k-space region, wherein a higher number of k-space profiles are acquired at more central slice positions along the slice direction and a lower number of the k-space profiles are acquired at more peripheral slice positions along the slice direction, and the k-space profiles are acquired at a higher temporal density from the slices at more central k-space positions than from the slices in the more peripheral k-space region, and
 reconstruct one or more MR image from the MR signals.

14. The magnetic resonance (MR) device of claim 12, wherein the method performed by the MR device further includes:
 acquiring the MR signals corresponding to radial k-space profiles in the ellipsoid around a center of k-space into the MR image.

15. The magnetic resonance (MR) device of claim 12, wherein MR signals corresponding to k-space positions outside of an ellipsoid centered on a center of k-space are removed prior to reconstructing the MR image.

16. A magnetic resonance (MR) system comprising:
 a main magnet coil configured to generate a main magnetic field within an examination volume;
 a plurality of gradient coils configured to generate switched magnetic field gradients within the examination volume;
 at least one RF coil configured to generate RF pulses in the examination volume and/or receive MR signals from an object in the examination volume;
 one or more computer processors configured to:
  control the at least one RF coil and the plurality of gradient coils to subject the object to an imaging sequence including at least one RF pulse and switched magnetic field gradients,
  control the at least one RF coil and the plurality of gradient coils to acquire MR signals according to a stack-of-stars scheme, the MR signals being acquired as radial k-space profiles from a plurality of parallel slice positions, and slices disposed at each of a plurality of positions along a slice direction, the MR signals being acquired more frequently from the slices at more central k-space positions along the slice direction than from the slices at more peripheral k-space positions along the slice direction such that a radial k-space sampling density is higher at the more central k-space positions along the slice direction and a number of differently oriented k-space profiles per slice varies such that (1) a higher number of k-space profiles are acquired at more central slice positions along the slice direction and a lower number of k-space profiles are acquired at more peripheral slice positions along the slice direction, and (2) the k-space profiles are acquired at a higher temporal sampling density from the slices at the more central k-space positions than from slices at the more peripheral k-space positions, and
  reconstruct one or more MR images from the acquired MR signals.

17. The magnetic resonance (MR) system of claim 16, wherein the one or more computer processors are configured to reconstruct the MR signals corresponding to k-space profiles in an ellipsoid around a center of k-space into the one or more MR images.

18. The magnetic resonance (MR) system according to claim 16, wherein the one or more computer processors are further configured to:
 acquire the MR signals from k-space profiles in an ellipsoid defined centered on a center of k-space, a radial density of the acquired MR signals from adjacent the center of k-space exceeding the Nyquist criterion and the radial density of the MR signals corresponding to the radial k-space profiles outside of the ellipsoid being less than or equal to the Nyquist criterion.

* * * * *